US010386438B2

(12) United States Patent
Trzasko et al.

(10) Patent No.: US 10,386,438 B2
(45) Date of Patent: Aug. 20, 2019

(54) SYSTEM AND METHOD FOR GENERATING SPATIAL MAPS OF MECHANICAL PARAMETERS USING GRAPH-CUT BASED OPTIMIZATION

(71) Applicants: Joshua D. Trzasko, Rochester, MN (US); Armando Manduca, Rochester, MN (US)

(72) Inventors: Joshua D. Trzasko, Rochester, MN (US); Armando Manduca, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 898 days.

(21) Appl. No.: 14/689,149

(22) Filed: Apr. 17, 2015

(65) Prior Publication Data

US 2015/0309140 A1 Oct. 29, 2015

Related U.S. Application Data

(60) Provisional application No. 61/984,157, filed on Apr. 25, 2014.

(51) Int. Cl.
*G01R 33/56* (2006.01)
*G01R 33/563* (2006.01)

(52) U.S. Cl.
CPC .... *G01R 33/56358* (2013.01); *G01R 33/5608* (2013.01)

(58) Field of Classification Search
None
See application file for complete search history.

(56) References Cited

U.S. PATENT DOCUMENTS

| 7,423,430 | B1* | 9/2008 | Sharif | G01R 33/56325 324/309 |
|---|---|---|---|---|
| 7,800,368 | B2* | 9/2010 | Vaughan | G01R 33/583 324/318 |
| 8,781,197 | B2* | 7/2014 | Wang | G01R 33/54 382/131 |
| 2011/0025333 | A1* | 2/2011 | Ehman | G01R 33/56358 324/318 |

(Continued)

OTHER PUBLICATIONS

Huifang Wang et al.; A three-dimensional quality-guided phase unwrapping method for MR elastography; IOP Publishing-Physics in Medicine and Biology; Published Jun. 10, 2011; pp. 3935-3952 (Year: 2011).*

(Continued)

*Primary Examiner* — Daniel R Miller
*Assistant Examiner* — Nasima Monsur
(74) *Attorney, Agent, or Firm* — Quarles & Brady LLP (57) ABSTRACT

A system and method for generating a spatial map of parameters that describe the mechanically-induced harmonic motion information present within a magnetic resonance elastography (MRE) data set is provided. A first temporal harmonic signal is estimated using a graph-cut based optimization strategy, and can subsequently be used to generate a spatial map of mechanical parameters. The MRE data set is used to estimate the harmonic. The spatial map is of a mechanical parameter derived from the estimated harmonic.

16 Claims, 4 Drawing Sheets

(56) References Cited

U.S. PATENT DOCUMENTS

2013/0218002 A1* 8/2013 Kiraly ............... G01R 33/4814
600/411

OTHER PUBLICATIONS

Jose M. Bioucas-Dias, Senior Member, IEEE, and Gongalo Valadao; Phase Unwrapping via Graph Cuts; IEEE Transactions on Image Processing, vol. 16, No. 3, Mar. 2007; pp. 698-709 (Year: 2007).*

Geman, et al., Stochastic relaxation, Gibbs distributions, and the Bayesian restoration of images, IEEE Transactions on pattern analysis and machine intelligence 6 (1984): 721-741.

Besag, On the statistical analysis of dirty pictures, Journal of the Royal Statistical Society. Series B (Methodological) (1986): 259-302.

Greig, et al., Exact Maximum A Posteriori Estimation for Binary Images, J. Royal Statistical Soc. Series B, vol. 51, No. 2, pp. 271-279, 1989.

Ford & Fulkerson, Flows in networks, (1962) Chapter 1, pp. 1-35.

Cormen, et al, Introduction to algorithms. MIT press, 2009, Chapter 26, pp. 643-698.

Ishikawa, Exact Optimization for Markov Random Fields with Convex Priors, IEEE Trans. Pattern Analysis and Machine Intelligence, vol. 25, No. 10, pp. 1333-1336, Oct. 2003.

Kolmogorov, et al., What energy functions can be minimized via graph cuts?, IEEE Transactions on Pattern Analysis & Machine Intelligence 2 (2004): 147-159.

Boykov, et al., An experimental comparison of min-cut/max-flow algorithms for energy minimization in vision, IEEE transactions on pattern analysis and machine intelligence 26.9 (2004): 1124-1137.

Boykov, et al., Fast approximate energy minimization via graph cuts, IEEE Transactions on pattern analysis and machine intelligence 23.11 (2001): 1222-1239.

Bioucas-Dias, et al., Phase unwrapping via graph cuts, IEEE Transactions on Image processing 15.9 (2007): 698-709.

Raj, et al., Bayesian parallel imaging with edge-preserving priors, Magnetic Resonance in Medicine: An Official Journal of the International Society for Magnetic Resonance in Medicine 57.1 (2007): 8-21.

Hernando, et al., Robust water/fat separation in the presence of large field inhomogeneities using a graph cut algorithm, Magnetic Resonance in Medicine: An Official Journal of the International Society for Magnetic Resonance in Medicine 63.1 (2010): 79-90.

Boykov, et al., Graph Cuts in Vision and Graphics: Theories and Applications, Math. Models of C.Vision: The Handbook, edts. Paragios, Chen, Faugeras, pp. 100-118.

* cited by examiner

SYSTEM AND METHOD FOR GENERATING SPATIAL MAPS OF MECHANICAL PARAMETERS USING GRAPH-CUT BASED OPTIMIZATION

CROSS-REFERENCE TO RELATED APPLICATIONS

This application is based on, claims priority to, and incorporates herein by reference in its entirety, U.S. Provisional Patent Application Ser. No. 61/984,157, filed on Apr. 25, 2014, and entitled "Regularized Harmonic Estimation for Steady-State MR Elastography Using Graph Cuts."

STATEMENT REGARDING FEDERALLY SPONSORED RESEARCH

N/A

BACKGROUND

In magnetic resonance elastography (MRE), mechanically-induced motion in tissue is estimated from a time-encoded series of phase-contrast images. For steady-state MRE, relevant motion information is encoded within the first temporal harmonic signal (i.e., Fourier coefficient) of this image series. With an estimate of this quantity and knowledge of certain scan parameters, quantitative spatial maps of tissue stiffness can be constructed. The accuracy of the maps is intrinsically dependent on the accuracy of estimated temporal harmonic signal, which, in turn, depends on the quality of the phase-contrast images. Often the phase-contrast images can be of a low signal-to-noise ratio (SNR) or include phase wrapping. This leads to inaccurate estimates of the harmonic signals and inaccurate maps of tissue stiffness.

It would be desirable to have a system and method for generating spatial maps from temporal harmonic signals of increased accuracy despite a low SNR or phase wrapping in the phase-contrast images.

SUMMARY

The present disclosure overcomes the aforementioned drawbacks by providing a system and method for generating spatial maps of mechanical parameters of tissue in a subject from temporal harmonic signals of increased accuracy. The method may use graph-cut based optimization to estimate harmonic signals used to further estimate the mechanical parameters.

According to one aspect of the disclosure, a method for generating a spatial map of parameters that describe the mechanically-induced harmonic motion information present within a magnetic resonance elastography (MRE) data set is provided. The method may include acquiring the MRE data set, estimating a complex-valued first temporal harmonic signal using a graph-cut based optimization strategy, and generating the spatial map of tissue stiffness parameters using a mathematical inversion technique. The MRE data set is used to estimate the first harmonic signal. The spatial map of tissue stiffness is then derived from the estimated harmonic signal.

According to another aspect of the disclosure, a magnetic resonance imaging (MRI) system for generating a spatial map of parameters that describe the mechanically-induced harmonic motion information that is present within an MRE data set is provided. The system includes a magnet system configured to generate a polarizing magnetic field about at least a portion of a subject arranged in the MRI system and a magnetic gradient system including a plurality of magnetic gradient coils configured to apply at least one magnetic gradient field to the polarizing magnetic field. The MRI system also includes a radio frequency (RF) system configured to apply an RF field to the subject and to receive MR signals therefrom and a computer system. Further, the MRI system includes a driver system configured to deliver an oscillatory stress to the subject to, thereby, direct a shear wave through the subject. The computer system is programmed to control the driver system to deliver the oscillatory stress, control the RF system and the gradient system to acquire an MRE data set, estimate a first temporal harmonic signal using a graph-cut based optimization strategy, and generate the spatial map of mechanical parameter values. The MRE data set is used to estimate the first harmonic signal. The spatial map of a mechanical parameter is then derived from the estimated harmonic signal.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

A system and method for generating a spatial map of parameters that describe the mechanically-induced harmonic motion information present within an MRE data set is disclosed herein. The system and method can be used to process a magnetic resonance elastography (MRE) data set after the MRE data acquisition to generate temporal harmonic signals of increased accuracy even if the data set includes phase wrapping, has a low signal-to-noise ratio (SNR), or both. Those temporal harmonic signals can then be used to generate parameter maps of increased accuracy using MRE inversion methods.

An MRE data set may suffer from a low SNR, phase wrapping, or both. If such a data set is used, other approaches for estimating first temporal harmonic signals may become numerically unstable, or produce inaccurate results. Prior attempts were carried out to estimate the harmonic signals using gradient-based numerical optimization strategies accounting for noise in the raw MRI data. Despite promising initial results, the gradient-based numerical optimization strategy was viable only for data containing no phase wrapping. This limits the practicality of this approach of gradient-based optimization.

The system and method as disclosed herein can robustly estimate the harmonic signals despite the phase wrapping by using an optimization strategy based on graph cuts. Complex values can also be used in the system and method as disclosed herein to increase the accuracy of the estimates.

Figure 1:
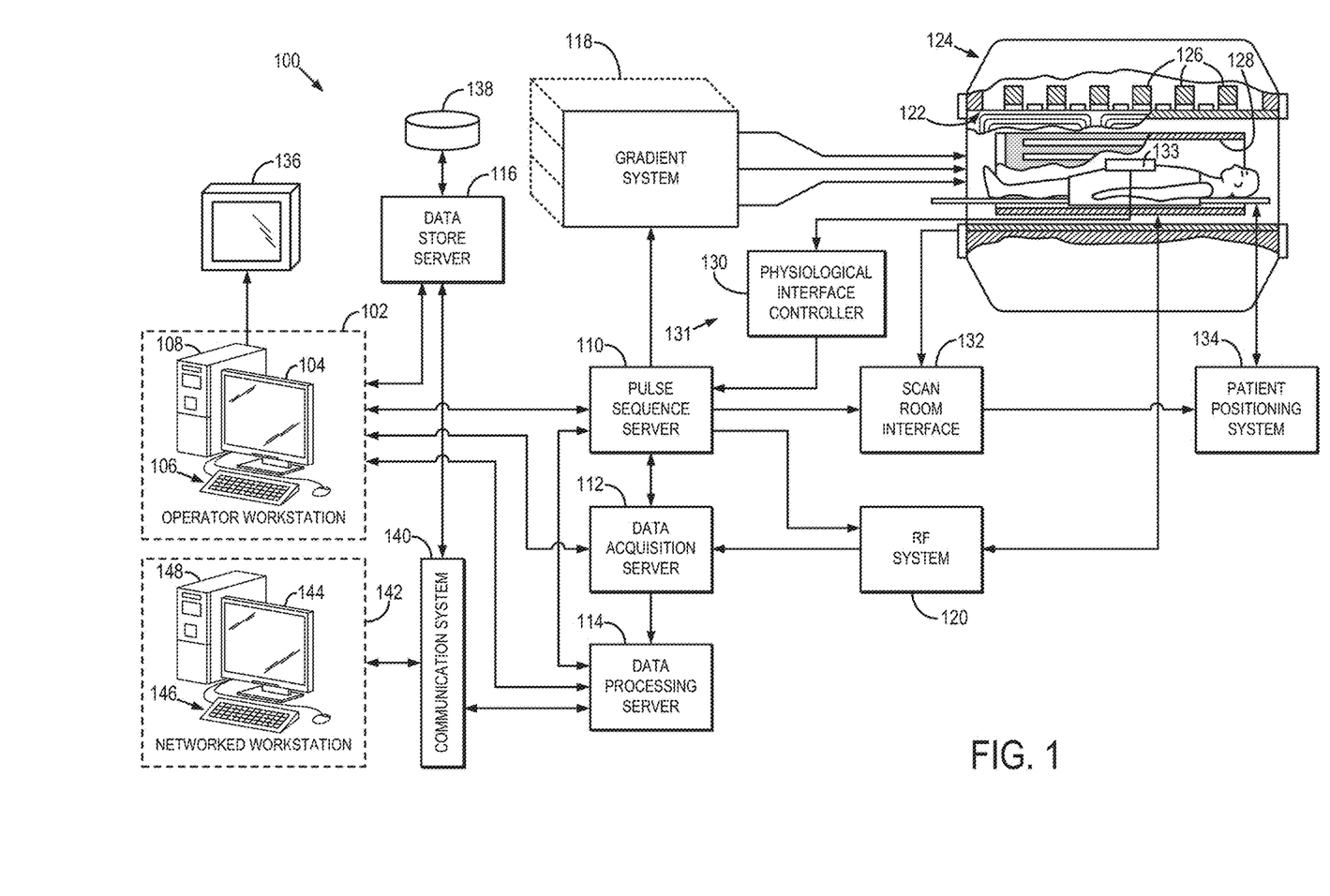
FIG. 1 is a block diagram of an example of a magnetic resonance imaging ("MRI") system.

MRE data sets can be acquired from an MRI system. Referring particularly to FIG. 1, an example of an MRI system 100 is illustrated. The MRI system 100 includes a workstation 102 having a display 104 and a keyboard 106. The workstation 102 includes a processor 108 that is commercially available to run a commercially-available operating system. The workstation 102 provides the operator interface that enables scan prescriptions to be entered into the MRI system 100. The workstation 102 is coupled to four servers: a pulse sequence server 110; a data acquisition server 112; a data processing server 114; and a data store server 116. The workstation 102 and each server 110, 112, 114, and 116 are connected to communicate with each other.

The pulse sequence server 110 functions in response to instructions downloaded from the workstation 102 to operate a gradient system 118 and a radio frequency (RF) system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128 (or specialized RF coils such as a head and neck or a knee coil, for example).

RF excitation waveforms are applied to the RF coil 128, or a separate local coil, such as a head coil, by the RF system 120 to perform the prescribed magnetic resonance pulse sequence. Responsive MR signals detected by the RF coil 128, or a separate local coil, are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays.

The RF system 120 also includes one or more RF receiver channels. The whole body RF coil 128 or one or more local coils or coil arrays can be used to receive RF signals. Each RF receiver channel includes an RF preamplifier that amplifies the MR signal received by the coil to which it is connected, and a detector that detects and digitizes the received MR signal. The magnitude of the received MR signal may be represented at any sampled point by the square root of the sum of the squares of the imaginary I and real Q components:

$$M = \sqrt{I^2 + Q^2} \quad [1],$$

and the phase of the received MR signal may also be determined:

$$\varphi = \tan^{-1}\left(\frac{Q}{I}\right). \quad [2]$$

The pulse sequence server 110 can optionally receive patient data from a physiological interface controller 130. For example, the physiological interface controller 130 can receive signals from a number of different sensors connected to the patient, such as electrocardiograph (ECG) signals from electrodes, or respiratory signals from a bellows or other respiratory monitoring device. Such signals are typically used by the pulse sequence server 110 to synchronize, or "gate," the performance of the scan with the subject's heart beat or respiration. Also, in the case of a magnetic resonance elastography (MRE) process, the physiological interface controller 130 can form part of a driver system 131 and be coupled to a driver 133. That is, the driver system 131 can be formed by the physiological interface controller 130, which can communicate with the pulse sequence server 110 and the driver 133 to carry out the acquisition of MRE data or MRE data sets using the MRI system 100. In particular, the physiological interface controller 130 can be configured to provide driving controls, such as pneumatic or acoustic waves or electrical or wireless commands, to the driver 133 to deliver an oscillatory stress to the subject to, thereby, direct a mechanical wave through the subject in coordination with pulsing of the gradient coil assembly 122 and operation f the MRI system 100, to acquire MRE data. As used herein, reference to "MR data" can also refer to the acquisition of MRE data or MRE data sets.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processing server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. In all these examples, the data acquisition server 112 acquires MR data and processes it in real-time to produce information that is used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown), from which they may be output to operator display 104 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network or communication system 140 to other facilities that may include other networked workstations 142.

The communication system 140 and networked workstation 142 may represent any of the variety of local and remote computer systems that may be included within a given clinical or research facility including the system 100 or other, remote location that can communicate with the system 100. In this regard, the networked workstation 142 may be functionally and capably similar or equivalent to the operator workstation 102, despite being located remotely and communicating over the communication system 140. As such, the networked workstation 142 may have a display 144 and a keyboard 146. The networked workstation 142 includes a processor 148 that is commercially available to run a commercially-available operating system. The networked workstation 142 may be able to provide the operator interface that enables scan prescriptions to be entered into the MRI system 100.

Figure 2:
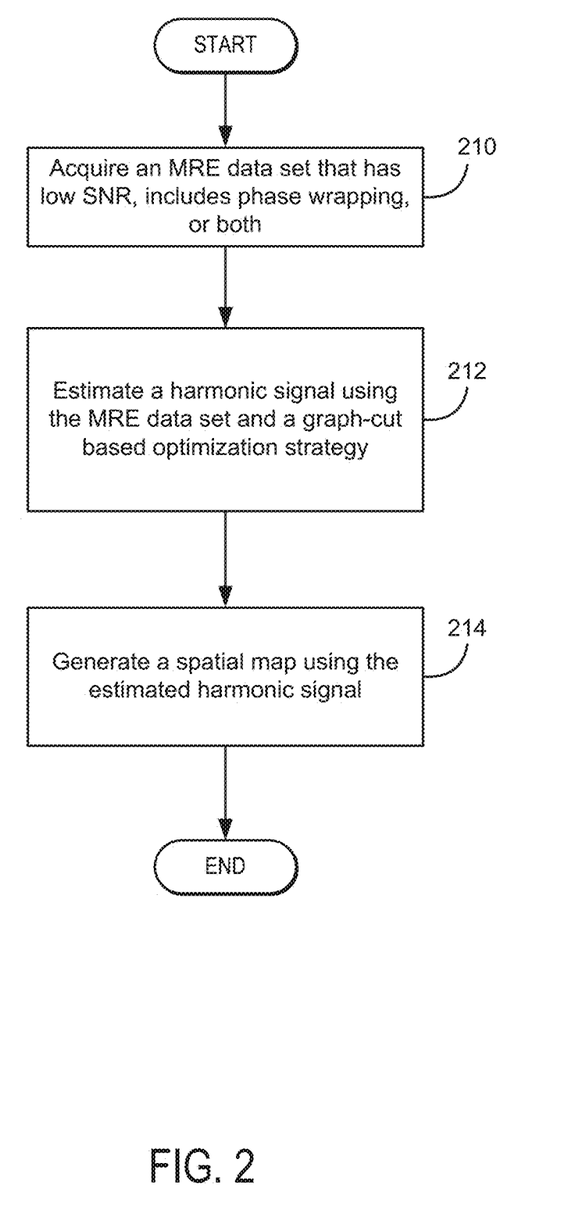
FIG. 2 is a flow chart representing the steps of an example method in accordance with the present application.

Referring to FIG. 2, a flowchart of an example method implemented according to the present application is provided. The methods disclosed herein can be used to generate a spatial map of parameters that describe the mechanically-induced harmonic motion information present within an MRE data set that may suffer from a low SNR, phase wrapping, or both. In step 210, an MRE data set is acquired. The data set can be acquired from an MRE system or a data storage by receiving, selecting, uploading, downloading, copying, or other similar action with respect to the data set. The data set may suffer from a low SNR, phase wrapping, or both. In step 212, a first temporal harmonic signal is estimated using the data set and a graph-cut based optimization strategy. Lastly, in step 214, a spatial map of a mechanical parameter is generated using the estimated harmonic signal.

It was attempted to unwrap phases independently in each phase contrast image (i.e., a time frame of a wave image) using a graph cut optimization strategy frame by frame and then to estimate harmonic signals from the unwrapped data set. In the systems and methods according to the present application, an initial harmonic signal is estimated first and then phase unwrapping is conducted using a graph cut optimization strategy while the harmonic estimates are updated with the initial harmonic estimate as the initial value for the updates. Estimates using the system and method as disclosed herein are statistically more accurate than the prior attempts.

To further increase the accuracy of the estimates, complex values are used in the method as disclosed herein.

The following assumes single direction MRE acquisitions. One skilled in the art would appreciate that the method can be naturally generalized for any MRE acquisition strategy, including asymmetric and simultaneous multi-direction approaches, and models for those approaches mathematically mirror the case described below. With a steady-state MRE acquisition, the signal observed by receiver channel $c \in [0, C-1]$ during phase offset $\phi \in [0, \Phi-1]$ at spatial position x (total N voxels) for a single motion-encoded direction can be modeled as:

$$G_{\pm}[x,\phi,c] = M[x,\phi,c]\exp(\pm jRe\{\eta[x]\zeta[\phi]\}) + Z_{\pm}[x,\phi,c] \quad [3],$$

where ± denotes the polarity of motion encoding, M is a potentially time-varying background signal, η is the target harmonic signal, $\zeta[\phi]=\exp(j2\pi\phi/\Phi)$, and $Z_{\pm}[:,:,.] \sim CN(0,\Psi)$ is complex normal (CN) noise with mean of 0, covariance of Ψ, and $\Lambda=E[Z^*Z]=2N\Phi\Psi^T$. MRI system non-idealities (e.g., concomitant fields, off-resonance, gradient nonlinearity) can also be included in Eq. 3 and a person skilled in the art would appreciate that models including those non-idealities mathematically mirror the case described below. The signal can be expressed as an NT×C matrix:

$$G_{\pm}=H_{\pm}(\eta)M+Z_{\pm} \quad [4],$$

where $[H_{\pm}(\eta)]_{(x,\phi),(x,\phi)}=\exp(\pm jRe\{\eta[x]\zeta[\phi]\})$ is diagonal, and the set of all measurements can be represented as a 2NT×C matrix $G=[G_+^T\ G_-^T]^T=H(\eta)M+Z$. The method disclosed herein comprises identifying η that minimizes a cost function. The cost function can be constructed of a penalty and the marginalized negative log-likelihood of G:

$$J(\eta)=\lambda P(\eta)-\Sigma_{x,\phi}|K[x,\phi]|\cos(2Re\{\eta[x]\zeta[\phi]\}-\angle\{K[x,\phi]\}) \quad [5],$$

where $K[x,\phi]=\Sigma_{c,d}\Lambda^{-1}[c,d]G_+[x,\phi,c]\overline{G_-[x,\phi,c]}$, and $\lambda \geq 0$ (e.g., 2500) is a user-selected regularization parameter. A quadratic smoothness penalty can be adopted:

$$P(\eta)=\Sigma_{x,b\in\Theta(x)}|\eta[x]-\eta[b]|^2 \quad [6],$$

where Θ[x] is a spatial neighborhood of x (for example, Θ(x) comprising the 4 closest neighbors of x in an image). Other penalty models, such as those incorporating higher-order spatial derivative and using non-quadratic distance measures or alternative transform operators (e.g., wavelets or wave atoms), can also be used in place of Eq. 6. A penalty term can be used to promote selected properties in a final harmonic estimate, such as spatial smoothness. The computational challenge of this estimation problem comes from the presence of the cosine term in J(η), which is 2π-periodic and thus nonconvex. When a function is nonconvex, a global minimum can be difficult to find. This is because, if a function is convex, a global minimum can be found by descending in the direction of the gradient of the function. But this may lead to local minima instead if the function is nonconvex.

Figure 3:
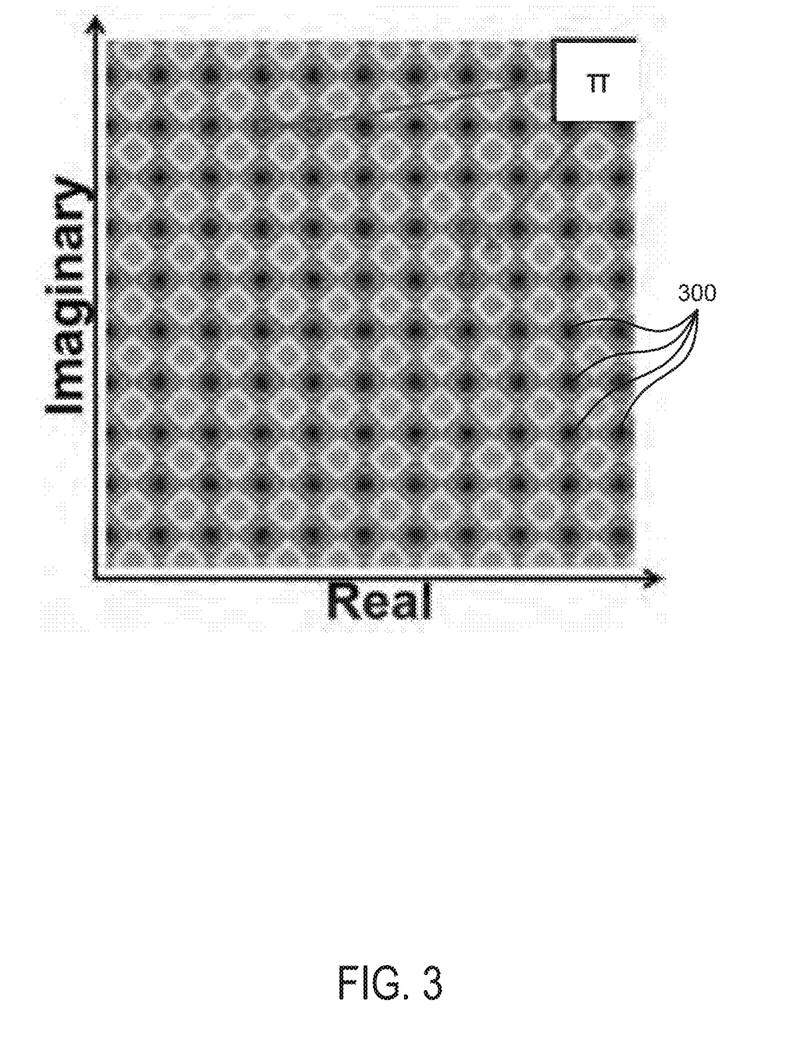
FIG. 3 is a example plot of the cost function J of a single voxel in the complex space.

J(η) is invariant to additive perturbations of the harmonic signal by any ε satisfying, $\forall x,\phi,\mod(Re\{(\varepsilon[x])\zeta[\phi]\},\pi)=0$. This is a higher-dimensional representation of the phase wrapping phenomenon. For example, if Φ=4, viable perturbations are $\varepsilon[x]=p\pi+jq\pi$, where both p, q are any integers. A plot of J(η) for Φ=4 and λ=0 over the complex domain of a single voxel is shown in FIG. 3. The plot shows a plurality of local minima 300. The many local minima 300 highlight the insufficiency of descent-based optimization methods for this class of problems.

In one configuration, the optimization strategy operates by executing a series of binary decisions. At iteration i, an update to the current harmonic signal, $\Delta_i$, is proposed and the voxel-wise decision $\eta_{i+1}[x]\in\{\eta_i[x],\eta_i[x]+\Delta_i[x]\}$ is made by forming a structured graph whose min-cut—the graph cut with minimum edges—satisfies $J(\eta_{i+1})\leq J(\eta_i)$. For the cost function illustrated in FIG. 3, basins (i.e., local minima 300) in the non-convex solution space can be reached if $\Delta_i[x]\in\{\pm\pi,\pm\pi,\pm j\pi\}$. With P(η) defined as in Eq. [6], each binary decision problem is graph representable if all elements of the complex update, $\Delta_i$, have the same phase. This condition can be naturally generalized from the established condition for real-valued graph-cut applications that all update values have the same sign (i.e., all positive or all negative).

Updates can be carried out according to a schedule. The above-described series of binary decisions can be executed using updates of different magnitude. For example, the magnitude of the updates, $|\Delta_i|$, can be progressively decreased during the iterative optimization process. The following example schedule of $|\Delta_i|$ for a T=4 phase offset acquisition can be used to update the complex harmonic signal: {π, π/2, π/4, π, π/8, π/16, π/32, π, π/64, π/128, π, π/128}. In this manner, large steps that are performed at the beginning of iteration effectively work to correct phase wraps, while smaller steps that are performed at the end of iteration refine the harmonic estimate and effectively smooth out noise-based signal fluctuations. The decision to switch from using one update magnitude value (e.g., $|\Delta_i|=\pi$) to another update value (e.g., $|\Delta_i|=\pi/2$) can be guided by a decision rule, such as that a pre-determined number of iterations at the first value have already been executed, or that the harmonic estimate is no longer exhibiting significant change after repeated updating with the first value. Like the magnitude, the phase of the complex-valued harmonic updates can also be determined according to a schedule. For a fixed value of the update magnitude ($|\Delta_i|$), a set of update phase values that uniformly sample the unit circle (i.e., in the range [0,2π)) can be employed. Both the number of phase updates and values of the update phases can be either deterministic or random. For example, for each update magnitude value ($|\Delta_i|$), one can cycle through the following four equispaced phase values: $\measuredangle \{\Delta_i\}=\{0, \pi/2, \pi, 3\pi/2\}$.

In one configuration, a harmonic estimate derived from the temporal Fourier transform of the series of phase contrast images is used as an initialize for the updates.

In one configuration, during MRE data acquisition, multi-frequency mechanical excitation may be performed. The systems and methods can be used to simultaneously estimate multiple complex harmonic signals per pixel by minimizing a single cost function using the graph-cut based optimization strategy.

Figure 4A:
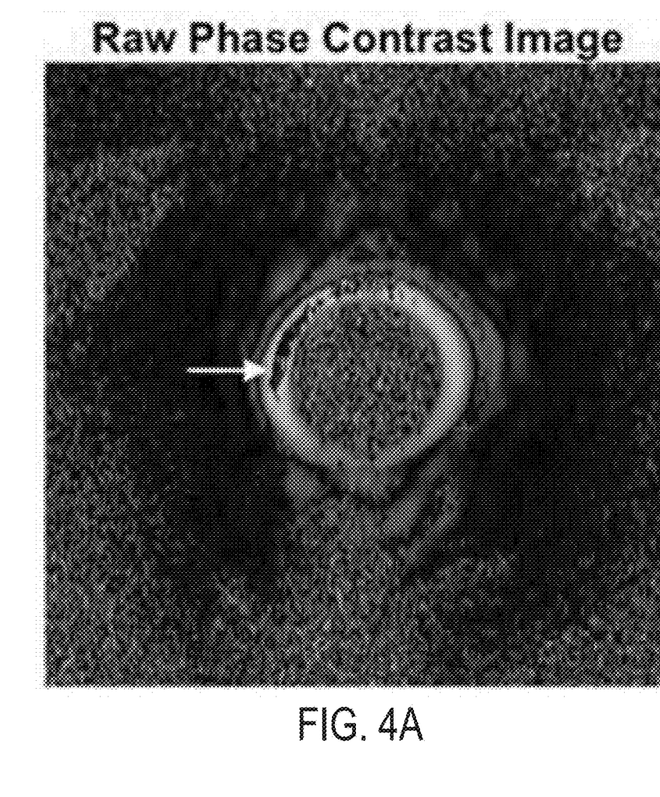
FIG. 4A is a raw image of an MRE phase contrast image series of the anal sphincter.
Figure 4B:
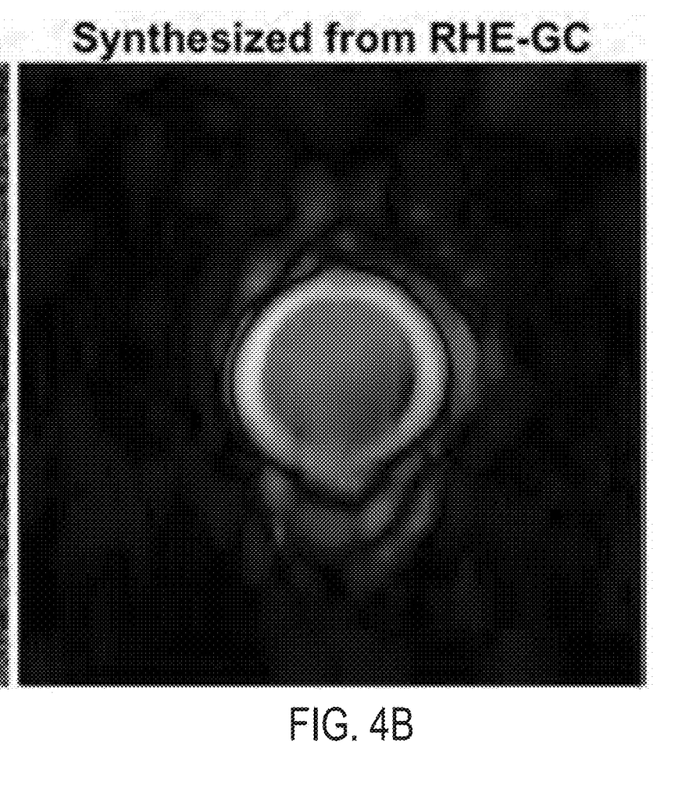
FIG. 4B is the corresponding wave field synthesized from harmonic signals estimated using the method as disclosed herein.

FIG. 4(A) shows one phase contrast image from an MRE series of the anal sphincter where phase wrap is present as the dark portion identified by the arrow. FIG. 4(B) the corresponding wave image synthesized from the harmonic estimate generated via the graph cut optimization strategy. Note the absence of phase wrap and reduction of noise with the graph-cut based estimate shown in FIG. 4(B). Also the process of harmonic estimation using the method disclosed herein simultaneously eliminates phase wrap and removes noise without compromising wave information. Additionally, false wave information is absent in low SNR regions in the periphery of the harmonic estimate image.

Therefore, systems and methods have been described for generating spatial maps of parameters that describe the mechanically-induced harmonic motion information present within an MRE data set acquired with an MRI system. The methods may include acquiring an MRE data, performing a harmonic estimation on the MRE data set using a graph-cut based optimization strategy, and generating a spatial map of mechanical parameter values using the harmonic estimates. In certain embodiments, complex values are used in the estimation. A person having ordinary skill in the art would recognize that an estimate of the harmonic signals enables construction of quantitative spatial maps of a mechanical parameter using any of various mathematical inversion techniques. In some embodiments, during MRE data acquisition, multi-frequency mechanical excitation is performed. Multiple complex harmonic signals per pixel are simultaneously estimated by minimizing a single cost function using the graph-cut based optimization strategy In certain embodiments, the mechanical parameter may be selected from the group consisting of stiffness, Young's modulus, complex shear modulus, attenuation, wave speed, or a combination thereof. The mechanical parameter may be quantitative or qualitative.

The graph-cut based optimization strategy may include executing a series of binary decisions. Executing a series of binary decisions may include proposing an update to a current harmonic signal; forming a structured graph; and making a voxel-wise decision based on the structured graph. The structured graph may comprise a min-cut where the cost function of the update to the current harmonic signal is less than or equal to the cost function of the current harmonic signal.

In certain embodiments, the MRE data may have a corresponding time series of phase contrast images. The harmonic estimation may be initialized by a harmonic signal estimated from a temporal Fourier transform of the phase contrast image series.

In certain embodiments, a cost function that is minimized via the graph-cut optimization strategy to estimate the first harmonic signal explicitly models MRI system non-idealities such as off-resonance effects or concomitant fields. In certain other embodiments, the cost function explicitly describes alternative MRE data encoding strategies, such as asymmetric or simultaneous direction motion encoding gradient sequences.

In some embodiments, the cost function uses a penalty term to promote certain properties in a final harmonic estimate such as spatial smoothness.

A system for generating a spatial map of a mechanical parameter is also provided. The system comprises an MRI system and a means for imparting a mechanical stress to a subject, such as a patient. The means of imparting a mechanical stress can be internal or external to the subject. An internal means of imparting a mechanical stress may include respiration or cardiac pulsations. An external means of imparting a mechanical stress may include mechanical sources of motion.

The present invention has been described in terms of one or more preferred embodiments, and it should be appreciated that many equivalents, alternatives, variations, and modifications, aside from those expressly stated, are possible and within the scope of the invention.

This disclosure contains citations denoted by bracketed numbers (for example, [1], [2], etc.). The citations refer to the following references, each of which is incorporated herein in its entirety by reference.

The invention claimed is:

1. A magnetic resonance imaging (MRI) system comprising:
   a magnet system configured to generate a polarizing magnetic field about at least a portion of a subject;
   a plurality of gradient coils configured to apply a gradient field to the polarizing magnetic field;
   a radio frequency (RF) system configured to apply an excitation field to the subject and acquire MR image data therefrom;
   a driver system configured to deliver an oscillatory stress to the subject to, thereby, direct a mechanical wave through the subject;
   a computer system programmed to:
   a) control the driver system to deliver the oscillatory stress;
   b) control the RF system and the gradient coils to acquire a magnetic resonance elastography (MRE) data set while the oscillatory stress is being delivered;

c) simultaneously phase unwrap and estimate a complex valued first temporal harmonic signal to generate an estimated complex valued harmonic signal using a harmonic estimation on the MRE data set that uses a graph-cut based optimization strategy that operates directly on the MRE data set; and d) generate a spatial map of a mechanical parameter using the estimated harmonic signal.

2. The system of claim 1, wherein the harmonic signals include complex values.

3. The system of claim 2, wherein the computer system is configured to execute a series of binary decisions when using the graph-cut based optimization strategy, wherein the binary decisions include at least one of proposing an update to a current harmonic signal, forming a structured graph, or making a voxel-by-voxel decision based on the structured graph.

4. The system of claim 3, wherein, to execute a series of binary decisions, the computer system is configured to propose an update to a current harmonic signal, form a structured graph, and make a voxel-wise decision on the update based on the structured graph.

5. The system of claim 4, wherein the structured graph comprises a min-cut where a cost function of the update is less than or equal to a cost function of the current harmonic signal.

6. The system of claim 1, wherein the MRE data set includes a corresponding phase contrast image series, and an initial value to estimate the harmonic signal is the first temporal harmonic signal estimated from a temporal Fourier transform of the phase contrast image series.

7. A method for generating a spatial map of a mechanical parameter from a magnetic resonance elastography (MRE) data set, the method including steps comprising:
   a) acquiring the MRE data set using a magnetic resonance imaging (MRI) system;
   b) simultaneously phase unwrapping and estimating a complex valued first temporal harmonic signal to generate an estimated complex valued harmonic signal using a harmonic estimation on the MRE data set that uses a graph-cut based optimization strategy that operates directly on the MRE data set;
   c) generating a spatial map of the mechanical parameter using the estimated harmonic signal; and
   d) displaying the spatial map for a user.

8. The method of claim 7, wherein the harmonic signals include complex values.

9. The method of claim 8, wherein step b) includes executing a series of binary decisions using the graph-cut based optimization strategy, wherein the binary decisions include at least one of proposing an update to a current harmonic signal, forming a structured graph, or making a voxel-by-voxel decision based on the structured graph.

10. The method of claim 9, wherein executing a series of binary decisions includes proposing an update to a current harmonic signal, forming a structured graph, and making a voxel-wise decision on the update based on the structured graph.

11. The method of claim 10, wherein the structured graph comprises a min-cut where a cost function of the update is less than or equal to a cost function of the current harmonic signal.

12. The method of claim 7, wherein the M RE data set includes a corresponding phase contrast image series, and step b) is initialized by the first temporal harmonic signal estimated from a temporal Fourier transform of the phase contrast image series.

13. The method of claim 7, wherein step a) includes performing multi-frequency mechanical excitation; and step b) includes simultaneously estimating multiple complex harmonic signals per pixel by minimizing a single cost function using the graphcut based optimization strategy.

14. The method of claim 7, further comprising minimizing a cost function via the graph-cut optimization strategy to estimate the first temporal harmonic signal wherein the cost function models signals in the MRE data set with a signal model that include MRI system non-idealities selected from the group consisting essentially of off-resonance effects, gradient nonlinearities, concomitant fields, and combinations thereof.

15. The method of claim 7, further comprising minimizing a cost function via the graph-cut optimization strategy to estimate the first temporal harmonic signal describing a plurality of MRE data encoding strategies, including asymmetric or simultaneous direction motion encoding gradient sequences.

16. The method of claim 7, further comprising minimizing a cost function via the graph-cut optimization strategy to estimate the first temporal harmonic signal, wherein the cost function includes a penalty term that promotes spatial smoothness in the estimated first temporal harmonic.

* * * * *

UNITED STATES PATENT AND TRADEMARK OFFICE
CERTIFICATE OF CORRECTION

PATENT NO. : 10,386,438 B2
APPLICATION NO. : 14/689149
DATED : August 20, 2019
INVENTOR(S) : Joshua D. Trzasko et al.

Page 1 of 1

It is certified that error appears in the above-identified patent and that said Letters Patent is hereby corrected as shown below:

In the Specification

Column 6, Line 15, "$G=[G_+^T \ G_-^T]^T = H(\eta)M+Z.$" should be --$G=[G_+^T \ G_-^T]^T = H(\eta)M+Z.$--.

Column 6, Line 60, "$\in \{\pm\pi, \pm\pi, \pm j\pi\}$" should be --$\in \{\pm\pi, \pm j\pi\}$--.

In the Claims

Column 10, Claim 12, Line 17, "M RE" should be --MRE--.

Column 10, Claim 14, Line 31, "include" should be --includes--.

Signed and Sealed this
Twelfth Day of November, 2019

Andrei Iancu
*Director of the United States Patent and Trademark Office*